(12) United States Patent
Pietambaram et al.

(10) Patent No.: US 12,243,825 B2
(45) Date of Patent: Mar. 4, 2025

(54) HYBRID CONDUCTIVE VIAS FOR ELECTRONIC SUBSTRATES

(71) Applicant: Intel Corporation, Santa Clara, CA (US)

(72) Inventors: Srinivas Pietambaram, Chandler, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/326,569

(22) Filed: May 21, 2021

(65) Prior Publication Data

US 2022/0375866 A1    Nov. 24, 2022

(51) Int. Cl.
H01L 23/538 (2006.01)

(52) U.S. Cl.
CPC ...... *H01L 23/5384* (2013.01); *H01L 23/5381* (2013.01); *H01L 23/5386* (2013.01)

(58) Field of Classification Search
CPC .............. H01L 23/5385; H01L 23/5384; H01L 23/5381; H01L 23/5386; H01L 24/08; H01L 24/80; H01L 25/0657; H01L 25/50
See application file for complete search history.

(56) References Cited

U.S. PATENT DOCUMENTS

| | | | |
|---|---|---|---|
| 10,340,249 B1 | 7/2019 | Yu et al. | |
| 2014/0264930 A1 | 9/2014 | Yu et al. | |
| 2016/0148869 A1* | 5/2016 | Schenker | H01L 21/02167 438/618 |
| 2016/0293572 A1* | 10/2016 | We | H01L 23/5381 |
| 2016/0343666 A1* | 11/2016 | Deshpande | H01L 23/5383 |
| 2018/0204797 A1* | 7/2018 | Lin | H01L 21/02282 |
| 2020/0273803 A1 | 8/2020 | Hsu et al. | |
| 2021/0090993 A1 | 3/2021 | Yu et al. | |
| 2024/0027494 A1* | 1/2024 | Tong | G01R 1/07378 |
| 2024/0038718 A1* | 2/2024 | Hung | H01L 24/96 |

FOREIGN PATENT DOCUMENTS

WO    2015026342    2/2015

OTHER PUBLICATIONS

Extended European Search Report for European Patent Application No. 22163994.1, dated Sep. 28, 2022.

* cited by examiner

*Primary Examiner* — Zandra V Smith
*Assistant Examiner* — John M Parker
(74) *Attorney, Agent, or Firm* — Essential Patents Group, LLP

(57) ABSTRACT

An electronic substrate may be fabricated to include a fine pitch dielectric layer having an upper surface, a coarse pitch dielectric layer on the upper surface of the fine pitch dielectric layer, and at least one hybrid conductive via extending through the fine pitch dielectric layer and the coarse pitch dielectric layer. The hybrid conductive via is fabricated such that a portion thereof that extends through the fine pitch dielectric layer is smaller than a portion extending through the coarse pitch dielectric layer, which results in a stepped configuration, wherein a portion of the hybrid conductive via abuts the upper surface of the fine pitch dielectric layer. In an embodiment of the present description, an integrated circuit package may be formed with the electronic substrate, wherein at least two integrated circuit devices may be attached to the electronic substrate, such that the bridge provides device-to-device interconnection therebetween.

20 Claims, 10 Drawing Sheets

HYBRID CONDUCTIVE VIAS FOR ELECTRONIC SUBSTRATES

TECHNICAL FIELD

Embodiments of the present description generally relate to the field of integrated circuit package fabrication, and, more specifically, to an integrated circuit assembly including an electronic substrate having a bridge embedded therein for electrical signal connection between integrated circuit devices, wherein the electronic substrate includes hybrid conductive vias for effective electrical attachment with high-density interconnects of bridge.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages arm referred to in the art as multi-device, multi-chip packages (MCPs), or partitioned devices, and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

To address interconnection concerns, a bridge may be embedded in a substrate to which the integrated circuit devices are attached. These bridges support dense integrated circuit device-to-integrated circuit device interconnects, such as from a first integrated circuit device edge to a second integrated circuit device edge, and may support a number of signal lines through the bridge itself. Instead of using an expensive silicon interposer with through silicon vias, the bridge may be an inactive silicon structure or an active silicon device that is embedded in the substrate, enabling the dense integrated circuit device-to-integrated circuit device interconnects only where needed. Standard flip-chip processes may be used to connect the integrated circuit devices to the substrate for robust power delivery and to the bridge within the substrate. Thus, a resulting integrated circuit package may be considerably smaller than an integrated circuit package that is only interconnected with conductive routes within the substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
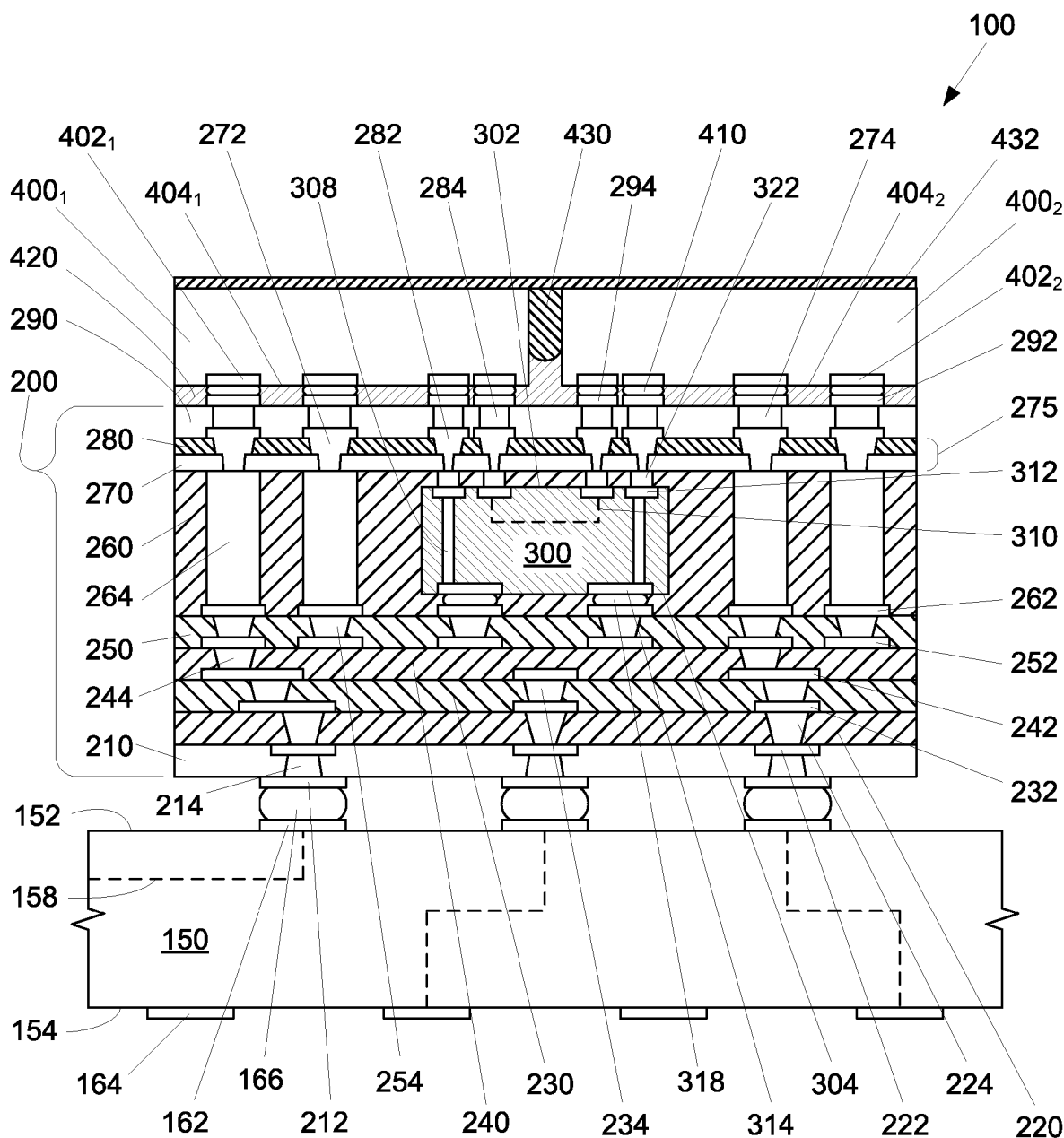
FIG. 1 is a side cross-sectional view of an integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

As previously discussed, the integrated circuit industry, in order to reduce the size of integrated circuit packages and components, is utilizing bridges embedded within electronic substrates to form interconnections between partitioned integrated circuit devices. For future generations of such integrated device partitioning, multiple bridges that can connect the integrated devices at much finer bump pitches (25 microns or lower) than that which can currently be delivered by technologies are needed. As will be understood, current approaches to embedded bridges suffer from high cumulative Bump Thickness Variation (BTV) and as the number of bridges to be embedded increases, the cost of embedding and yields will suffer. Alternate architectures and approaches have been proposed and investigated. One such approach is an omni-directional interconnect patches or bridge, which will be known to those skilled in the art. Omni-directional interconnect bridge may enable fine interconnections between the integrated circuit devices either through a passive bridge or an active integrated circuit die. To enable the fine interconnections, a routing layer that is formed after embedding the bridge in the electronic substrate must overlay both fine pitch connection structures in the embedded region and coarse connection structures in the electronic substrate in the non-embedded region. However, as the fine pitches or interconnections become smaller, it becomes more difficult to connect the bridge.

Embodiments of the present description allow for the scaling of electronic substrates with embedded bridges, such as omni-directional interconnect patches. This scaling may be achieved with an electronic substrate fabricated to include a fine pitch dielectric layer having an upper surface, a coarse pitch dielectric layer on the upper surface of the fine pitch dielectric layer, and at least one hybrid conductive via extending through the fine pitch dielectric layer and the coarse pitch dielectric layer. The hybrid conductive via is fabricated such that a portion thereof that extends through the fine pitch dielectric layer is smaller than a portion extending through the coarse pitch dielectric layer, which results in a stepped configuration, wherein a portion of the hybrid conductive via abuts the upper surface of the fine pitch dielectric layer. In an embodiment of the present description, an integrated circuit package may be formed with the electronic substrate, wherein at least two integrated circuit devices may be attached to the electronic substrate, such that the bridge provides device-to-device interconnection therebetween. In a further embodiment, the integrated circuit package may be electrically attached to an electronic board.

As shown in FIG. 1, an integrated circuit assembly 100 may be formed by electrically attaching an integrated circuit package 110 to a carrier substrate 150. The carrier substrate 150 may be any appropriate structure, including, but not limited to, an interposer, motherboard, or the like. The carrier substrate 150 may have a first surface 152 and an opposing second surface 154. The carrier substrate 150 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide materials, silica filled epoxy, glass reinforced epoxy material, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

The carrier substrate 150 may further include conductive routes 158 or "metallization" (shown in dashed lines) extending through the carrier substrate 150. As will be understood to those skilled in the art, the conductive routes 158 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the carrier substrate 150 may be a cored or coreless substrate. At least one of the conductive routes 158 may extend between a package connection bond pad 162 on or in the first surface 152 of the carrier substrate 150 and an external connection bond pad 164 on or in the second surface 154 of the carrier substrate 150 for attachment to external components (not shown). Additionally, at least one of the conductive routes 158 may be connected to other integrated circuit packages or devices (not shown) that are also electrically attached to the carrier substrate 150.

The integrated circuit package 110 may include a package substrate 200 having at least one integrated circuit device (shown as a first integrated circuit device $400_1$ and a second integrated circuit device $400_2$) electrically attached thereto. The package substrate 200 may comprise a plurality of dielectric layers (shown as a lower connection dielectric layer 210, a first lower dielectric layer 220, a second lower dielectric layer 230, a third lower dielectric layer 240, and a fourth lower dielectric layer 250) having conductive routes formed from conductive traces (including bond pads) and conductive vias. In one embodiment, a plurality of package-to-carrier bond pads 212 may be formed on the lower connection dielectric layer 210, which may be electrically attached to a plurality of first lower conductive traces 222 with corresponding lower connection vias 214 extending through the lower connection dielectric layer 210. The plurality of first lower conductive traces 222 may be electrically attached to a plurality of second lower conductive traces 232 with corresponding first lower conductive vias 224 extending through the first lower dielectric layer 220. The plurality of second lower conductive traces 232 may be electrically attached to a plurality of third lower conductive traces 242 with corresponding second lower conductive vias 234 extending through the second lower dielectric layer 230. The plurality of third lower conductive traces 242 may be electrically attached to a plurality of fourth lower conductive traces 252 with corresponding third lower conductive vias 244 extending through the third lower dielectric layer 240. The plurality of fourth lower conductive traces 252 may be electrically attached to a plurality of fifth lower conductive traces 262 with corresponding fourth lower conductive vias 254 extending through the fourth lower dielectric layer 250.

The lower connection dielectric layer 210, the first lower dielectric layer 220, the second lower dielectric layer 230, the third lower dielectric layer 240, and the fourth lower dielectric layer 250 may comprise build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive traces/bond pads 212, 222, 232, 242, 252, 262 and the conductive vias 214, 224, 234, 244, and 254 may be made of any appropriate conductive material, including, but not limited to, metals, such as copper, silver, nickel, gold, aluminum, alloys thereof, and the like.

In one embodiment, at least one bridge 300 may be electrically attached to at least one of the fifth lower conductive traces 262. As illustrated, the at least one bridge 300 may include a first surface 302 and an opposing second surface 304. The bridge 300 may include at least one device-to-device interconnection route 310 (illustrated as a dashed line) extending between an associated pair bond pads 312 in or on the first surface 302 of the at least one bridge 300, and may include a plurality of through-bridge conductive vias 308, wherein each of the plurality of through-bridge conductive vias 308 extends between one bond pad 312 in or on the first surface 302 of the bridge 300 and a bond pad 314 in or on the second surface 304 of the bridge 300. At least one bond pad 314 of the bridge 300 may be attached to at least one fifth lower conductive trace 262 with an attachment structure 318, such as a solder material or a conductive adhesive.

In one embodiment, the bridge 300 may comprise silicon-containing components. As will be understood to those skilled in the art, silicon bridges may be preferred because silicon processing technology is relatively advanced, and interconnect pitches and line widths for the device-to-device interconnection route 310 that are achievable using existing silicon process technology may be significantly smaller, and thus more dense, than what is possible using, for example, currently available technology for copper signal lines in polymer layers, as is common in electronic substrate fabrication.

As further shown in FIG. 1, the bridge 300 may be at least partially encapsulated with an embedding dielectric layer 260 disposed on the fourth lower dielectric layer 250. The embedding dielectric layer 260 may extend over the first surface 302 of the bridge 300 and may encapsulate the attachment structures 318. In one embodiment, at least one high-density conductive via 322 may extend through the embedding dielectric layer 260 and be electrically attached to the bond pads 312 in or on the first surface 302 of the bridge 300.

As shown in FIG. 1, at least one conductive pillar 264, such as a copper pillar, may extend through the embedding dielectric layer 260. The at least one conductive pillar 264 may be electrically attached to a corresponding fifth lower conductive trace 262 of the fifth lower dielectric layer 120.

As further shown in FIG. 1, the package substrate 200 may include a hybrid via dielectric layer 275 formed on the embedding dielectric layer 260. The hybrid via dielectric layer 275 may comprise a fine pitch dielectric layer 270 on the embedding dielectric layer 260, a coarse pitch dielectric layer 280, a plurality of substrate hybrid conductive vias 272 extending through the coarse pitch dielectric layer 280 and the fine pitch dielectric layer 270 and electrically attached to corresponding conductive pillars 264, and a plurality of bridge hybrid conductive vias 282 extending through the coarse pitch dielectric layer 280 and the fine pitch dielectric layer 270 and electrically attached to corresponding high-density conductive vias 322. The structure of the substrate hybrid conductive vias 272 and the bridge hybrid conductive vias 282 will be subsequently discussed in detail.

As further shown in FIG. 1, an upper connection dielectric layer 290, such as a solder resist layer, may be formed on the coarse pitch dielectric layer 280, on the plurality of substrate hybrid conductive vias 272, and on the plurality of bridge hybrid conductive vias 282. A plurality of upper connection conductive vias 274 may be formed to extend through the upper connection dielectric layer 290 and electrical attached to respective substrate hybrid conductive vias 274 and a plurality of high-density conductive vias 284 may be formed to extend through the upper connection dielectric layer 290 and be electrical attached to a respective bridge hybrid conductive vias 282. A plurality of device-to-substrate bond pads 294 may be formed on the upper connection dielectric layer 290 and electrical attached to respective upper connection conductive vias 274 and a plurality of high-density device-to-substrate bond pads 292 may be formed on the upper connection dielectric layer 290 and electrically attached to respective high-density conductive vias 284.

As further shown in FIG. 1, a plurality of integrated circuit devices (illustrated as first integrated circuit device 400$_1$ and second integrated circuit device 400$_2$) may be electrically attached to the package substrate 200. The first integrated circuit device 400$_1$ and the second integrated circuit device 400$_2$ (as well as any further integrated circuit devices that may be utilized) may be any appropriate device, including, but not limited to, a microprocessor, a chipset, a graphics device, a wireless device, a memory device, an application specific integrated circuit device, combinations thereof, stacks thereof, and the like. The first integrated circuit device 400$_1$ and the second integrated circuit device 400$_2$ may be attached to the package substrate 200 through a plurality of device-to-substrate interconnects 410, such as reflowable solder bumps or balls, in a configuration generally known as a flip-chip or controlled collapse chip connection ("C4") configuration. The device-to-substrate interconnects 410 may extend between bond pads 402$_1$ on a first surface 404$_1$ of the first integrated circuit device 400$_1$ and corresponding device-to-substrate bond pads 294, and between the first integrated circuit device bond pads 402$_1$ and corresponding high-density device-to-substrate bond pads 292 to form electrical connections therebetween. The device-to-substrate interconnects 410 may also extend between bond pads 402$_2$ on a first surface 404$_2$ of the second integrated circuit device 400$_2$ and corresponding device-to-substrate bond pads 294, and between the second integrated circuit device bond pads 402$_2$ and corresponding high-density device-to-substrate bond pads 292 to form electrical connections therebetween. It is understood that the first integrated circuit device bond pads 402$_1$ may be in electrical communication with integrated circuitry (not shown) within the first integrated circuit device 400$_1$, and that the second integrated circuit device bond pads 402$_2$ may be in electrical communication with integrated circuitry (not shown) within the second integrated circuit device 400$_2$. The bridge 300 may create an electrical signal connection between the first integrated circuit device 400$_1$ and the second integrated circuit device 400$_2$ with the at least one device-to-device interconnection route 310 extending between one bond pad 312 of the bridge 300 that is electrically attached to the first integrated circuit device 400$_1$ and another bond pad 312 of the bridge 300 that is electrically attached to the second integrated circuit device 400$_2$. In an embodiment, the bridge 300 may be a microprocessor, and the first integrated circuit device 400$_1$ and the second integrated circuit device 400$_2$ may each be a memory device.

The device-to-substrate interconnects 410 may be any appropriate electrically conductive material or structure, including but not limited to, solder balls, metal bumps or pillars, metal filled epoxies, or a combination thereof. In one embodiment, the device-to-substrate interconnects 410 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 410 may be copper bumps or pillars. In a further embodiment, the device-to-substrate interconnects 410 may be metal bumps or pillars coated with a solder material.

In one embodiment, an underfill material 420, such as an epoxy material, may be disposed between the package substrate 200 and the integrated circuit devices 400$_1$ and 400$_2$, and surrounding the plurality of device-to-substrate interconnects 410. As will be understood to those skilled in the art, the underfill material 420 may be dispensed between the first surfaces 402$_1$, 402$_2$ of the integrated circuit devices 400$_1$, 400$_2$, respectively, and the package substrate 200 as a viscous liquid and then hardened with a curing process. The underfill material 420 may also be a molded underfill material. The underfill material 420 may provide structural integrity and may prevent contamination, as will be understood to those skilled in the art. An encapsulation material 430 may be disposed over and/or between the integrated circuit devices 400$_1$, 400$_2$ for further structural integrity and contamination prevention. The encapsulation material 430 may be planarized to expose the integrated circuit devices 400$_1$ and 400$_2$ and a metallization layer 432 may be formed thereon. The integrated circuit package 110 may be attached to the carrier substrate 150 through a plurality of package-to-carrier substrate interconnects 166, such as a solder material, extending between the package-to-carrier bond pads 212 of the package substrate 200 and the package connection bond pad 162 of the carrier substrates 150.

Figure 2:
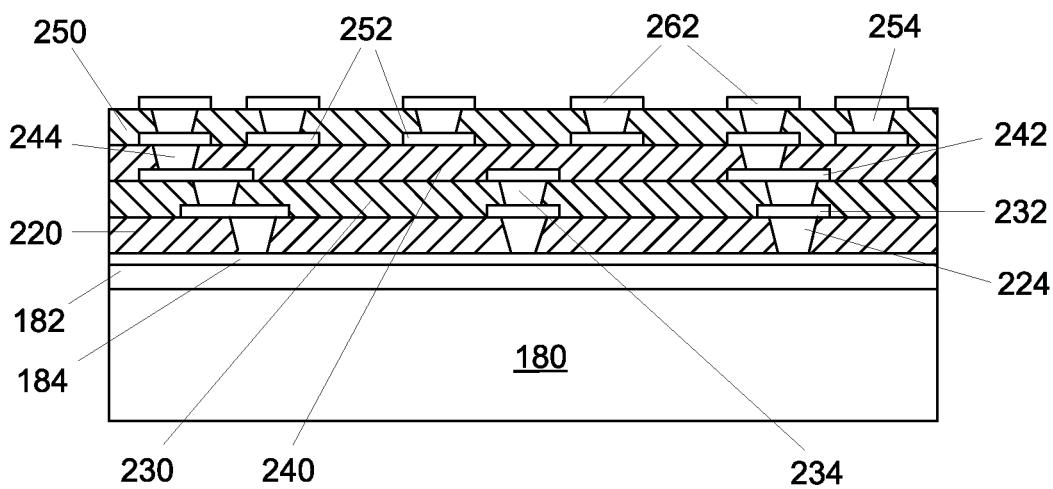
FIGS. 2-17 are side cross-sectional views of a process for fabrication an electronic substrate, according to an embodiment of the present description.

FIGS. 2-17 illustrate a process for fabricating the package substrate 200, according to an embodiment of the present description. FIG. 2 illustrates a planar carrier panel 180, such as a glass panel, coated with a release layer 182 and a conductive seed material layer 184 formed on the release layer 182. The planar carrier panel 180 may comprise any appropriate substantially rigid material, including but not limited to, glass, ceramic, metal, and the like. The release layer 182 may be a material that allows for the effective removal of the package substrate 200 after the fabrication thereof. In one embodiment, the conductive seed material layer 184 may be made of any appropriate conductive material, including but not limited to, metals, such as copper, silver, nickel, gold, and aluminum, alloys thereof, and the like. In a specific embodiment, the conductive seed material layer 184 may comprise a sputtered titanium/copper alloy layer.

As further shown in FIG. 2, the first lower dielectric layer 220, the second lower dielectric layer 230, the third lower dielectric layer 240, and the fourth lower dielectric layer 250, and associated conductive traces/bond pads 232, 242, 252, 262 and the conductive vias 224, 234, 244, 254 may be formed on the conductive seed material layer 184, as a redistribution structure for fan-out, by any known method, including, but not limited to, traditional semi-additive processes. As will be understood, the number of dielectric layers and associated trace and vias will depend on the amount of fan-out needed. Further, it is understood that when no fan-out is needed, only a single dielectric layer and vias extending therethrough is needed.

Figure 3:
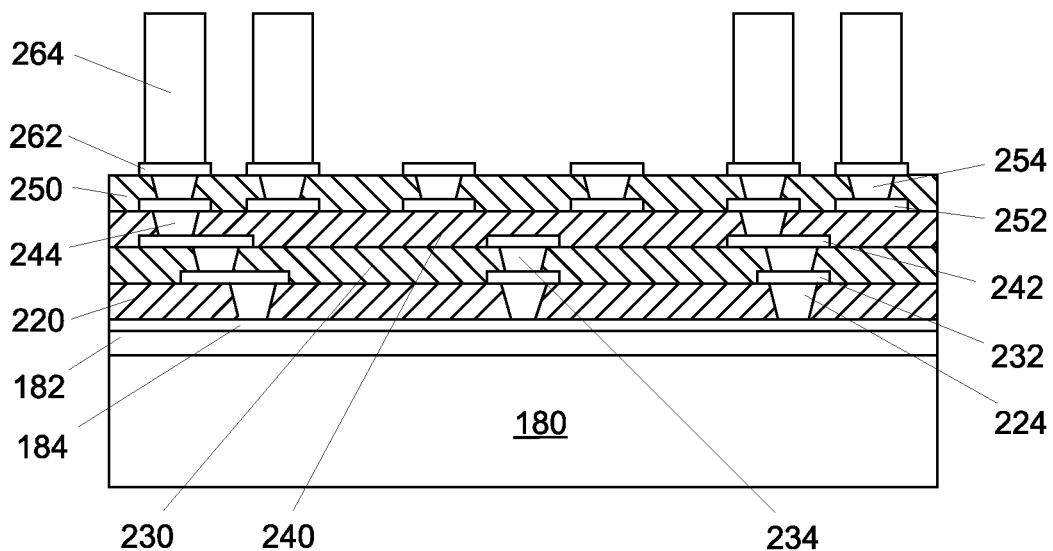
Figure 4:
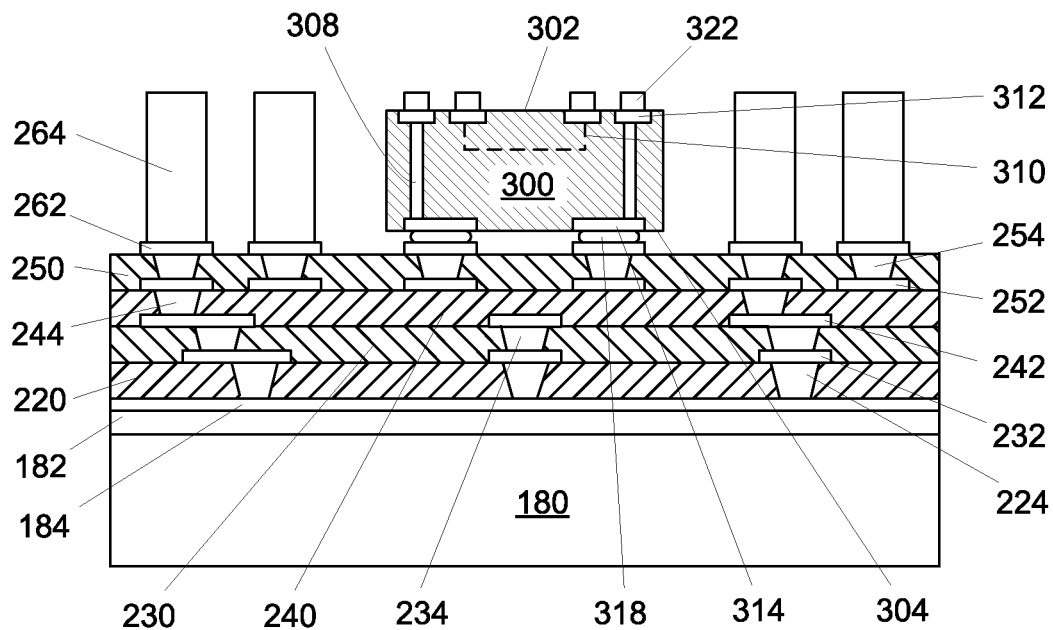
Figure 5:
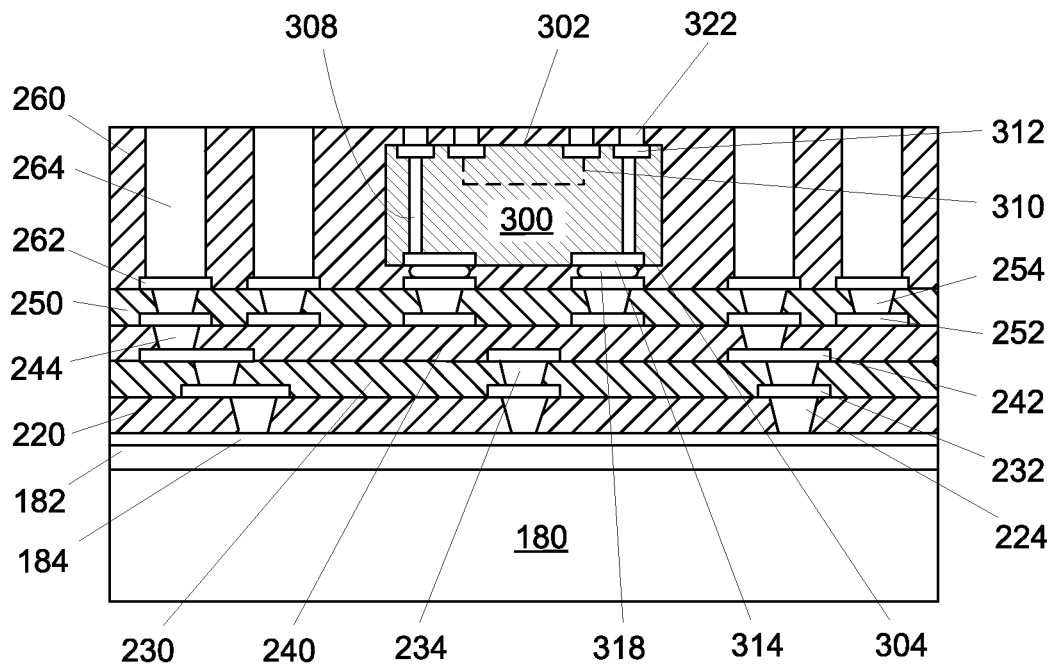

As shown in FIG. 3, the conductive pillars 264 may be formed by any known method on the fifth conductive traces 262. As shown in FIG. 4, the bond pads 314 in or on the second surface 304 of the bridge 300 may be electrically attached to associated fifth conductive traces 262 with attachment structures 318, such as a solder material. The embedding dielectric layer 260 may be formed over the conductive pillars 264 and the bridge 300, then planarized to expose a portion of the conductive pillars 264 and the high-density conductive vias 322, as shown in FIG. 5.

Figure 6:
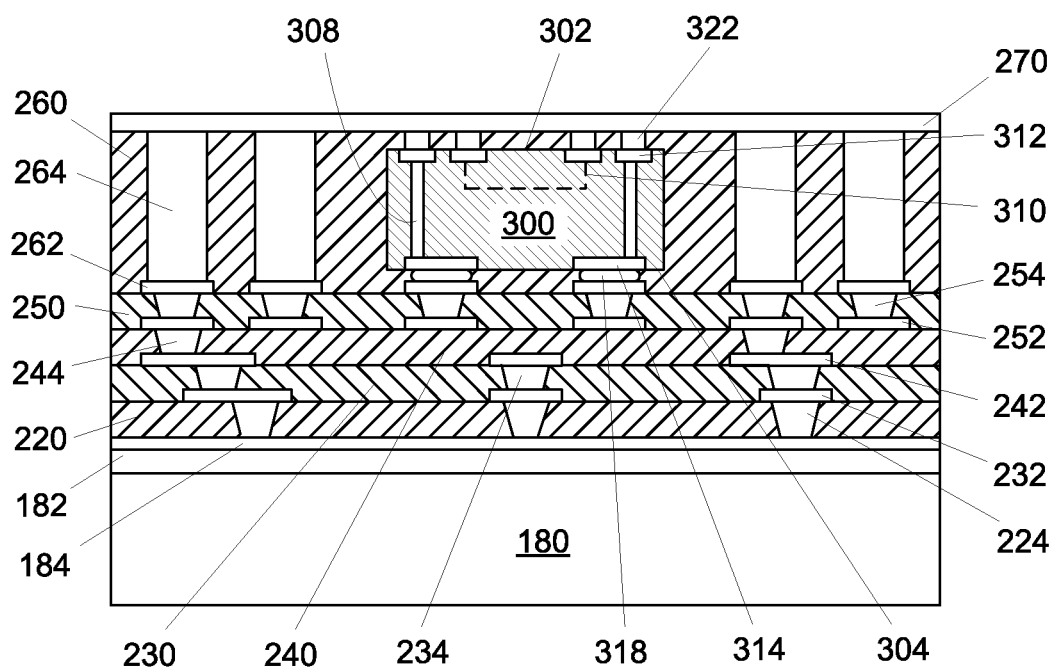

As shown in FIG. 6, the fine pitch dielectric layer 270 may be formed over the embedding dielectric layer 260, the conductive pillars 264, and the high-density conductive vias 322 of the bridge 300. The fine pitch dielectric layer 270 may be any dielectric material the capable of forming relatively fine openings therein, as will be discussed. In one embodiment, the fine pitch dielectric layer 270 may comprise oxides (such as silicon dioxide, carbon doped silicon oxide, fluorine doped silicon oxide, and the like), nitrides (such as aluminum nitride, silicon nitride, fluorine doped silicon nitride, and the like), carbides (such as titanium carbide, silicon carbide, and the like), oxynitrides (aluminum oxynitride, silicon oxynitride, and the like). In a specific embodiment of the present description, the fine pitch dielectric layer 270 may comprise an amorphous silicon nitride film. In one embodiment of the present description, the amorphous silicon nitride film may be between about 50 and 250 nanometers in thickness. In further embodiment, the amorphous silicon nitride film may be deposited with low temperature processes, including, but not limited to, physical vapor deposition, low-temperature plasma enhanced chemical vapor deposition, and the like. Such low temperature processes ensures that the dielectric layers below the fine pitch dielectric layer 270 are not impacted.

Figure 7:
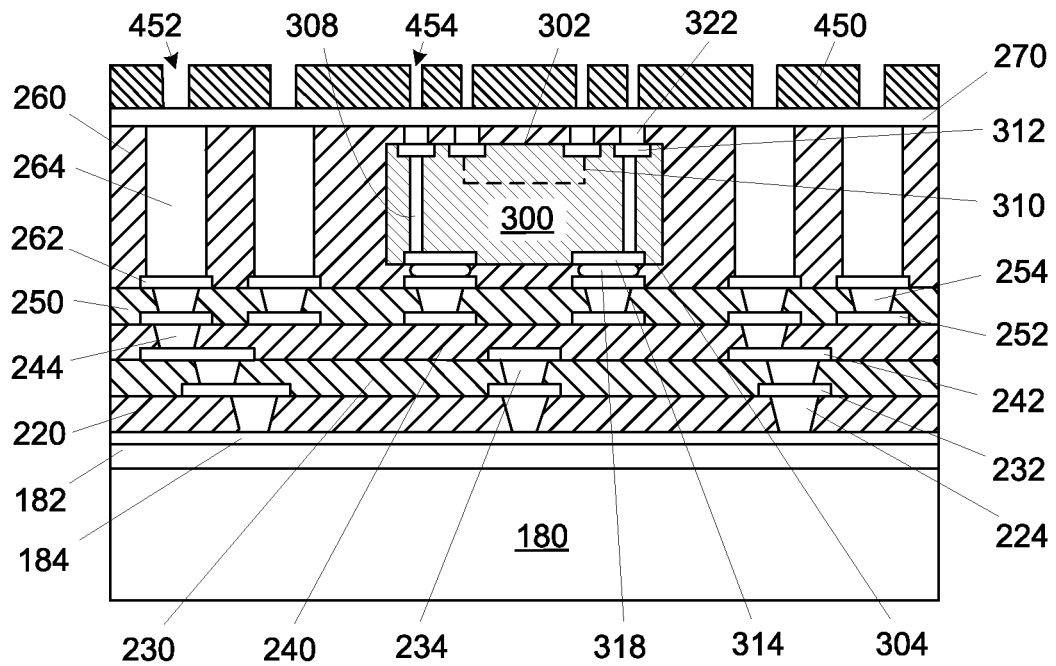
Figure 8:
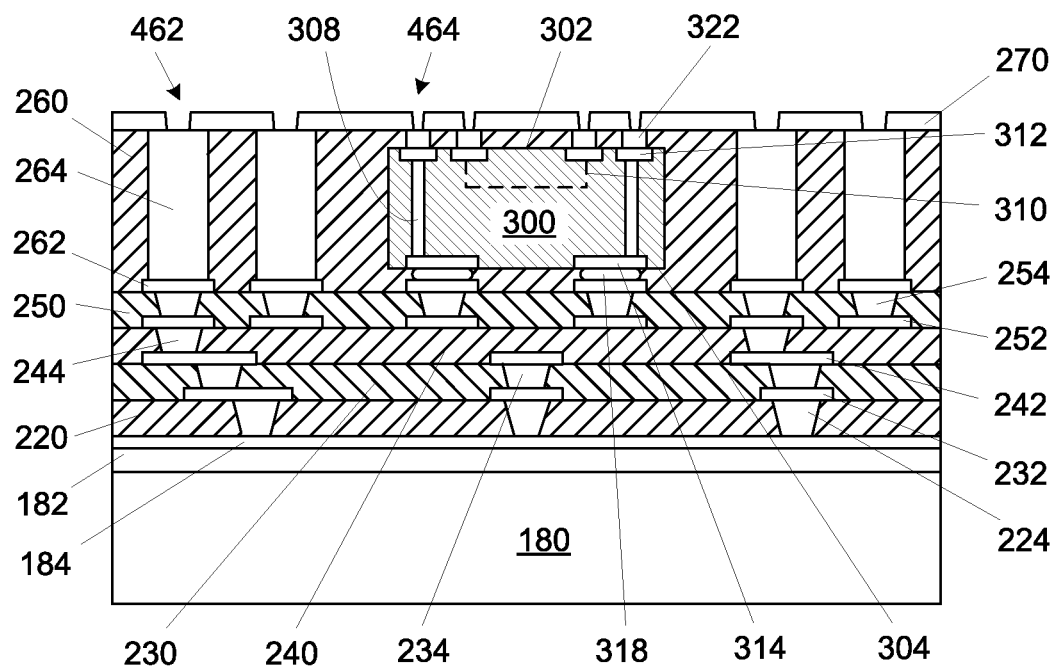

As shown in FIG. 7, a fine pitch mask 450 may be formed on the fine pitch dielectric layer 270, such as by slit coating or laminating a high-resolution photoresist material, followed by a lithographic process to form at least one fine bridge mask openings 452 and at least one fine substrate mask opening 454. As shown in FIG. 8, the fine pitch dielectric layer 270 may be etched, such as by a fluorine assisted dry etch, through the bridge mask openings 452 (see FIG. 7) and the fine substrate mask openings 454 (see FIG. 7) to form fine bridge openings 462 and fine substrate openings 464, respectively. The fine pitch mask 450 (see FIG. 7) may then be removed. As further shown in FIG. 8, the fine bridge openings 462 may expose a portion of respective high-density conductive vias 322 and the fine substrate openings 464 may expose a portion of respective conductive pillars 264. As will be understood, the use of the fine pitch dielectric layer 270 ensures the landing of the fine bridge openings 462 on the high-density conductive vias 322. In one embodiment of the present description, the fine bridge openings 462 may have an average width or diameter of about 25 microns or less.

Figure 9:
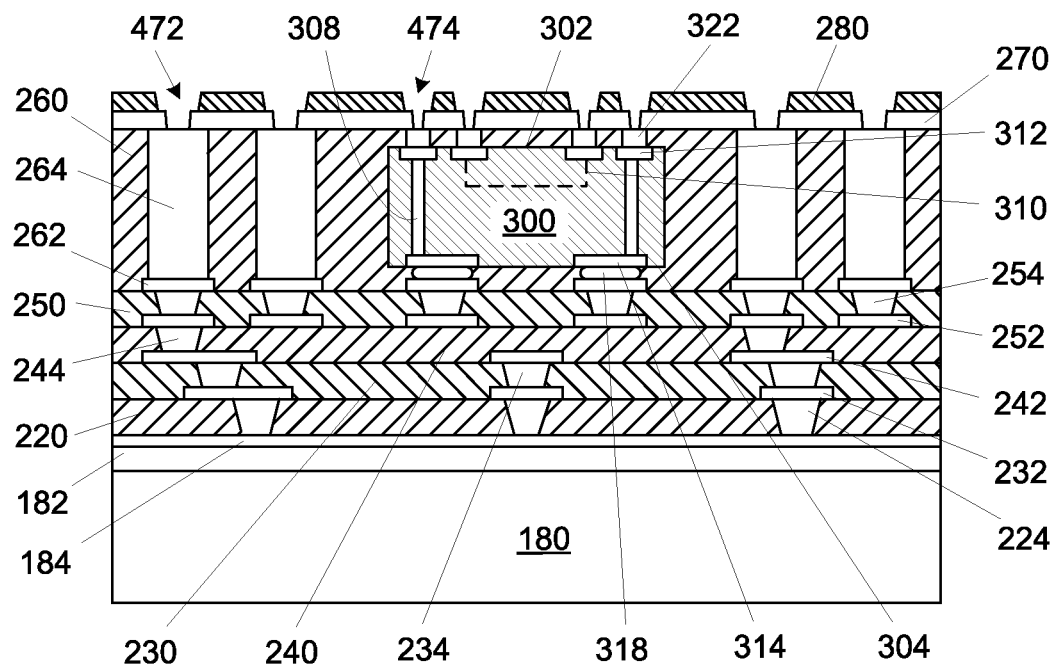

As shown in FIG. 9, the coarse pitch dielectric layer 280 may be formed, such as by lamination, over the fine pitch dielectric layer 270. As further shown in FIG. 9, coarse substrate openings 472 and coarse bridge openings 474 may be formed in the coarse pitch dielectric layer 280, wherein the coarse substrate openings 472 expose the fine substrate openings 462 (see FIG. 8) and the coarse bridge openings 474 expose associated fine bridge openings 264 (see FIG. 8). In one embodiment of the present description, the coarse pitch dielectric layer 280 may be a standard build-up film, such as an epoxy resin with inorganic filler material. The coarse substrate openings 472 and the coarse bridge openings 474 may be formed by laser drilling with carbon dioxide or ultraviolet lasers. As will be understood, the coarse substrate openings 472 and the coarse bridge openings 474 may be larger than the fine substrate openings 462 and fine bridge openings 464, as the overlay margin are not as tight.

Figure 10:
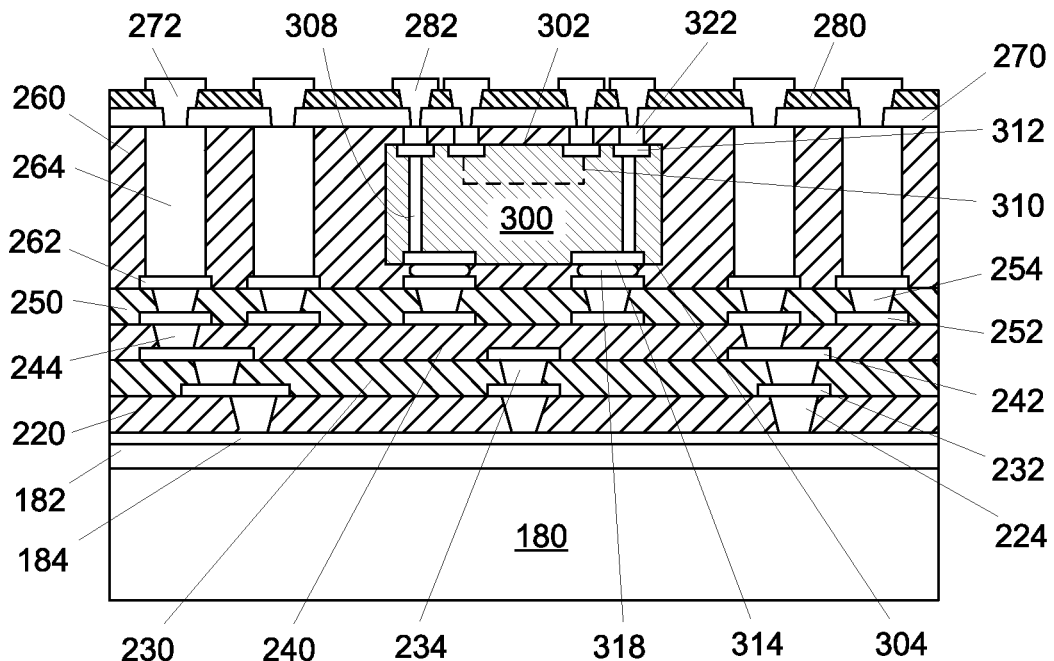

As shown in FIG. 10, conductive material may be pattern to form substrate hybrid conductive vias 272 and bridge hybrid conductive vias 274. In one embodiment of the present description, a semi-additive process may be used to pattern a copper metal material. As will be understood to those skilled in the art, this may enable high-bandwidth memory (HBM) and fully-integrated voltage regulator (FIVR) integration.

Figure 11:
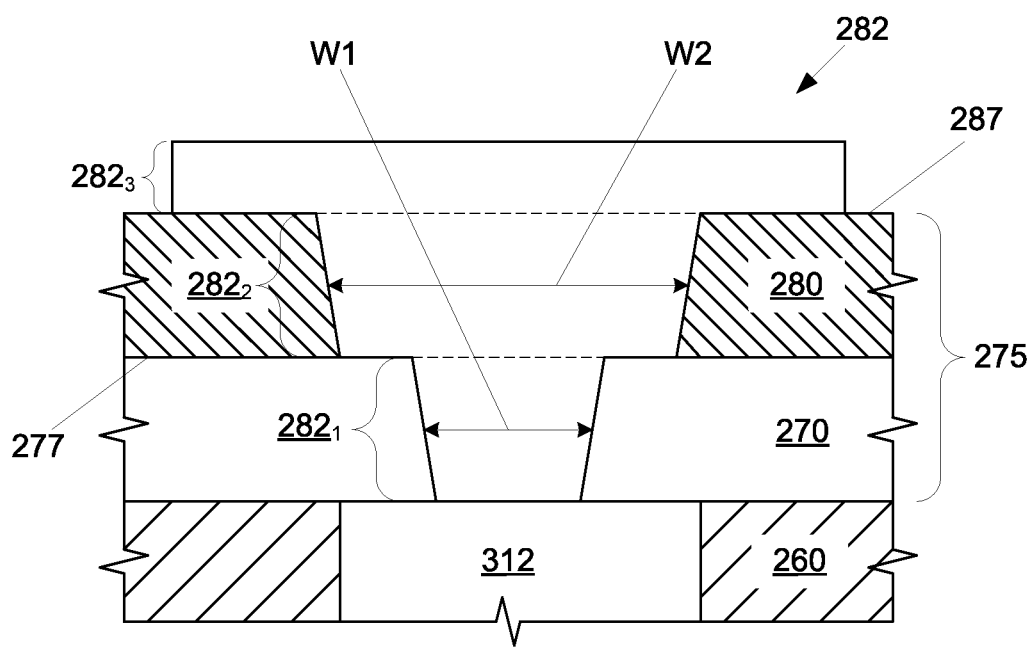

As will be understood, both the substrate hybrid conductive vias 272 and the bridge hybrid conductive vias 282 will each have a similar, unique shape/structure. FIG. 11 illustrates such a structure. For the sake of clarity and conciseness, FIG. 11 will only illustrate and discuss the shape/structure of the bridge hybrid conductive via 282. However, it is understood that the discussion applies equally to the substrate hybrid conductive vias 272 (see FIG. 10). As previously discussed, and as shown in FIG. 11, the formation of the bridge hybrid conductive vias 282 will result in each having a fine via portion $282_1$ extending through the fine pitch dielectric layer 270 and a coarse via portion $282_2$ extending through the coarse pitch dielectric layer 280. The fine via portion $282_1$ is demarked from the coarse via portion $282_2$ with an unlabeled dashed line for clarity. As shown in FIG. 11, due to the size difference between the fine substrate openings 464 (see FIG. 8) for fine via portion $282_1$ and the coarse substrate opening 474 (see FIG. 9) for the coarse via portion $282_2$, a portion of bridge hybrid conductive via 282 will reside on an upper surface 277 of the fine pitch dielectric layer 270. As further shown in FIG. 11, the bridge hybrid conductive via 282 may include a conductive trace portion $282_3$ extending over an upper surface 287 of the coarse pitch dielectric layer 270. The conductive trace portion 288 may be utilized for routing and/or interconnection purposes. In one embodiment of the present description, an average width or diameter W1 of the fine via portion $282_1$ may be between about than about 1% and 90% of an average width or diameter W2 of the coarse via portion $282_2$. In a specific embodiment, an average width or diameter W1 of the fine via portion $282_1$ may be less than about 50% of an average width or diameter W2 of the coarse via portion $282_2$. In a more specification embodiment, an average width or diameter W1 of the fine via portion $282_1$ may be between about than about 10% and 15% of an average width or diameter W2 of the coarse via portion $282_2$. In one embodiment of the present description, the average width or diameter W1 of the fine via portion $282_1$ may be 25 microns or less.

Figure 12:
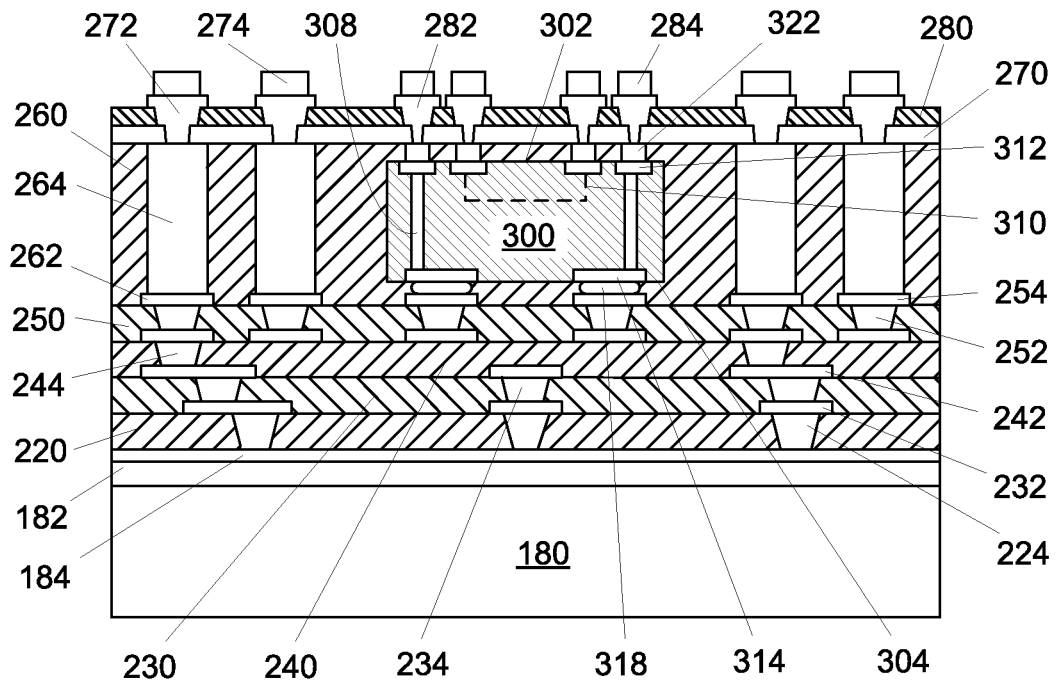
Figure 13:
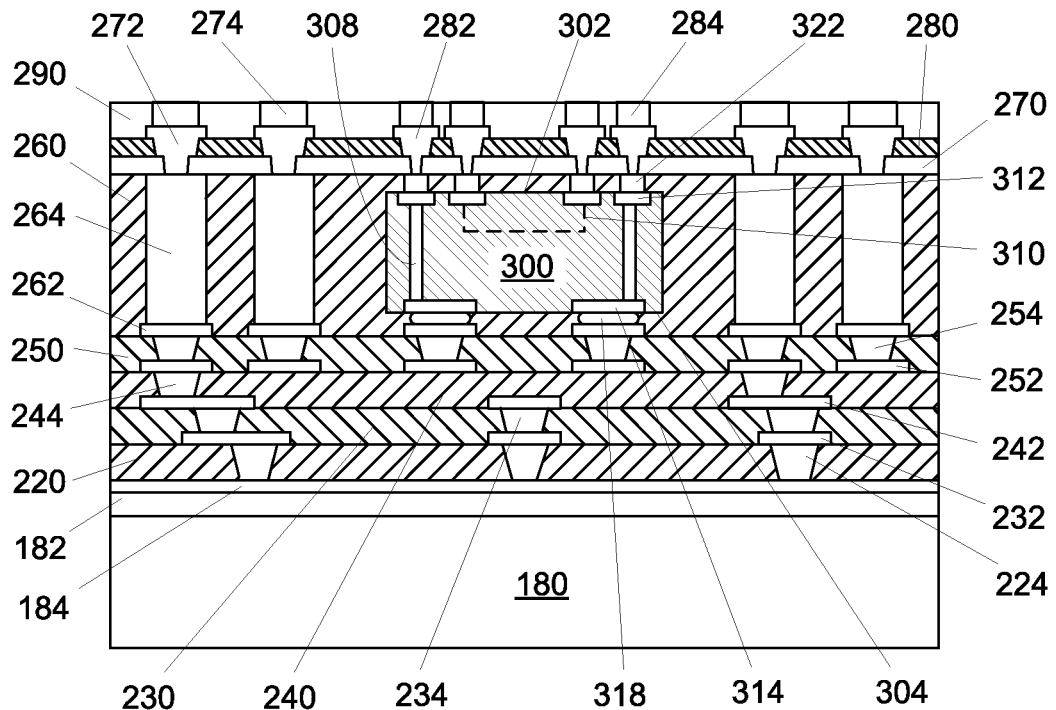
Figure 14:
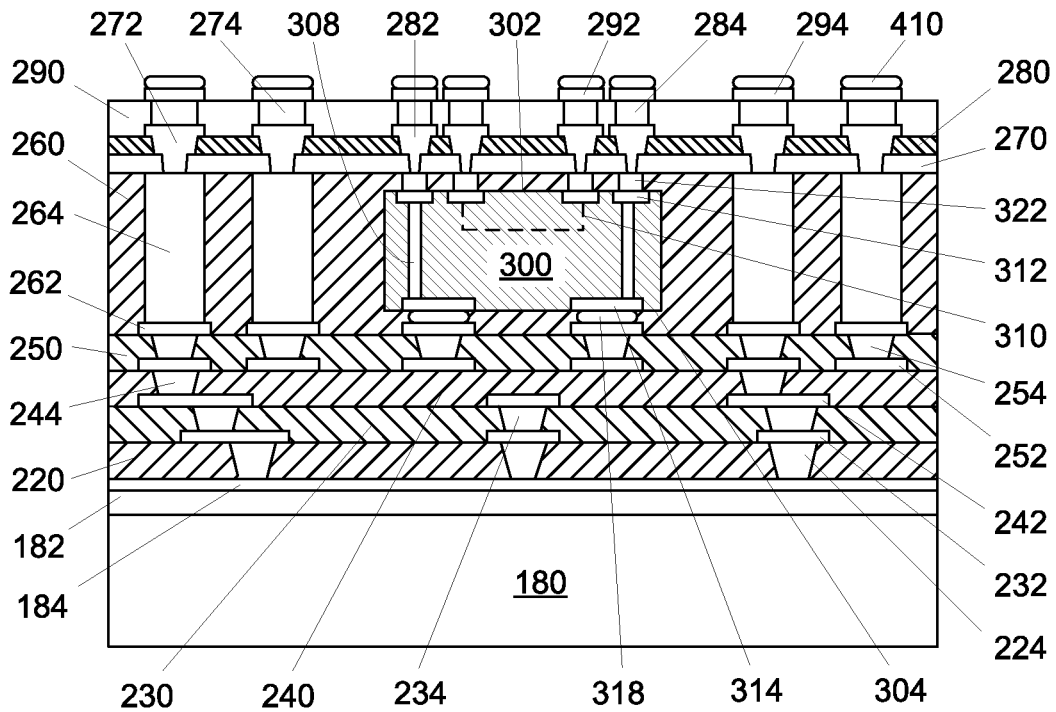

As shown in FIG. 12, the upper connection conductive vias 274 may be formed on respective substrate hybrid conductive vias 272 and the high-density conductive vias 284 may be formed on respective bridge hybrid conductive vias 282. As shown in FIG. 13, the upper connection dielectric layer 290 may be formed over the coarse pitch dielectric layer 280 and planarized to expose the upper connection conductive vias 274 and the high-density conductive vias 284. As shown in FIG. 14, the plurality of device-to-substrate bond pads 292 may be formed on the upper connection dielectric layer 290 and electrical attached to respective upper connection conductive vias 274 and the plurality of high-density device-to-substrate bond pads 294 may be formed on the upper connection dielectric layer 290 and electrically attached to respective high-density conductive vias 284. As further shown in FIG. 14, the device-to-substrate interconnects 410 may be formed on the plurality of device-to-substrate bond pads 292 and the plurality of high-density device-to-substrate bond pads 294.

Figure 15:
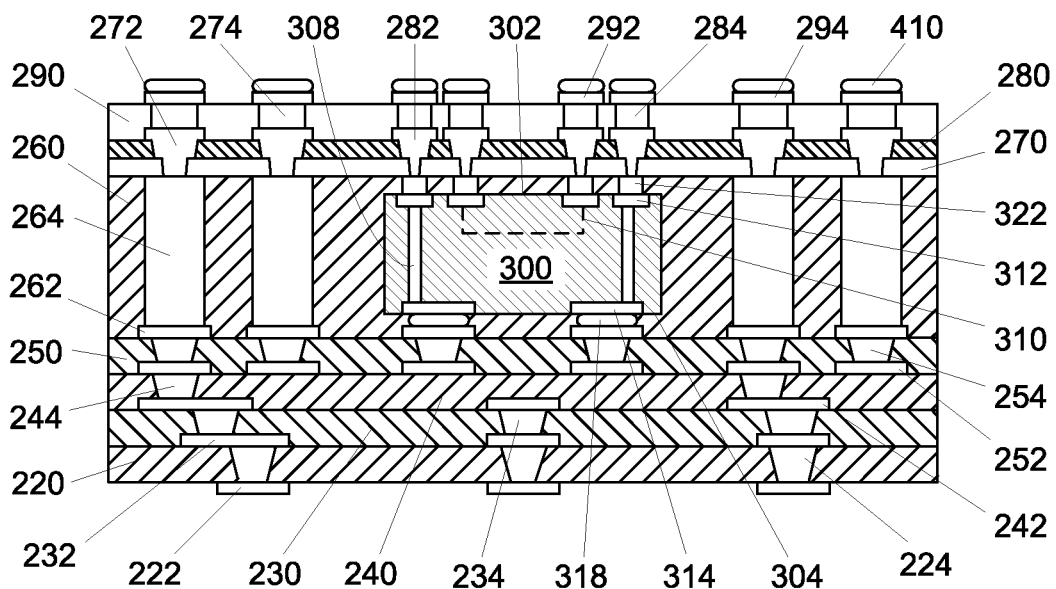
Figure 16:
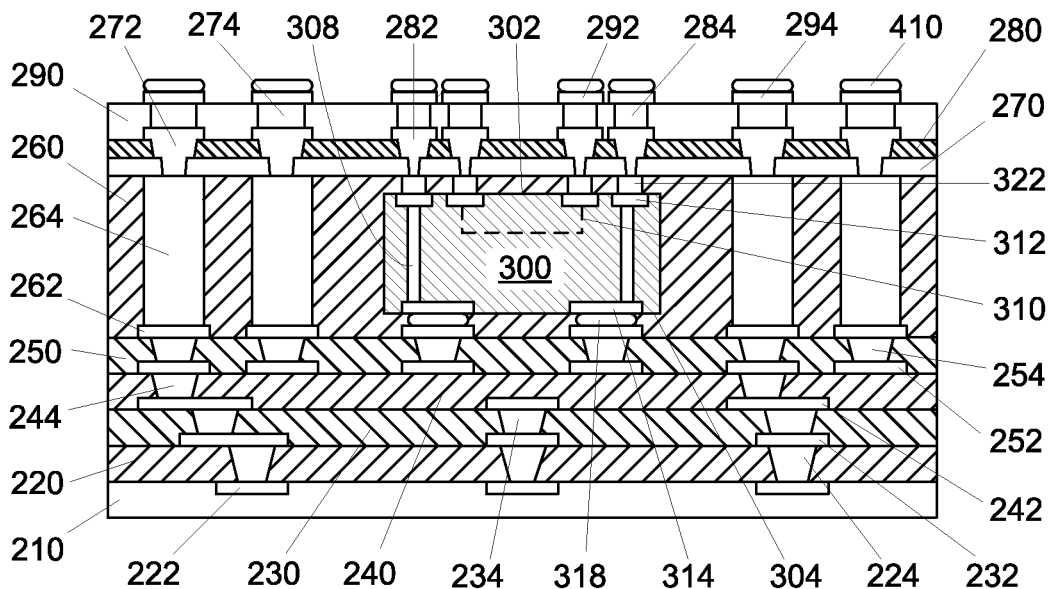
Figure 17:
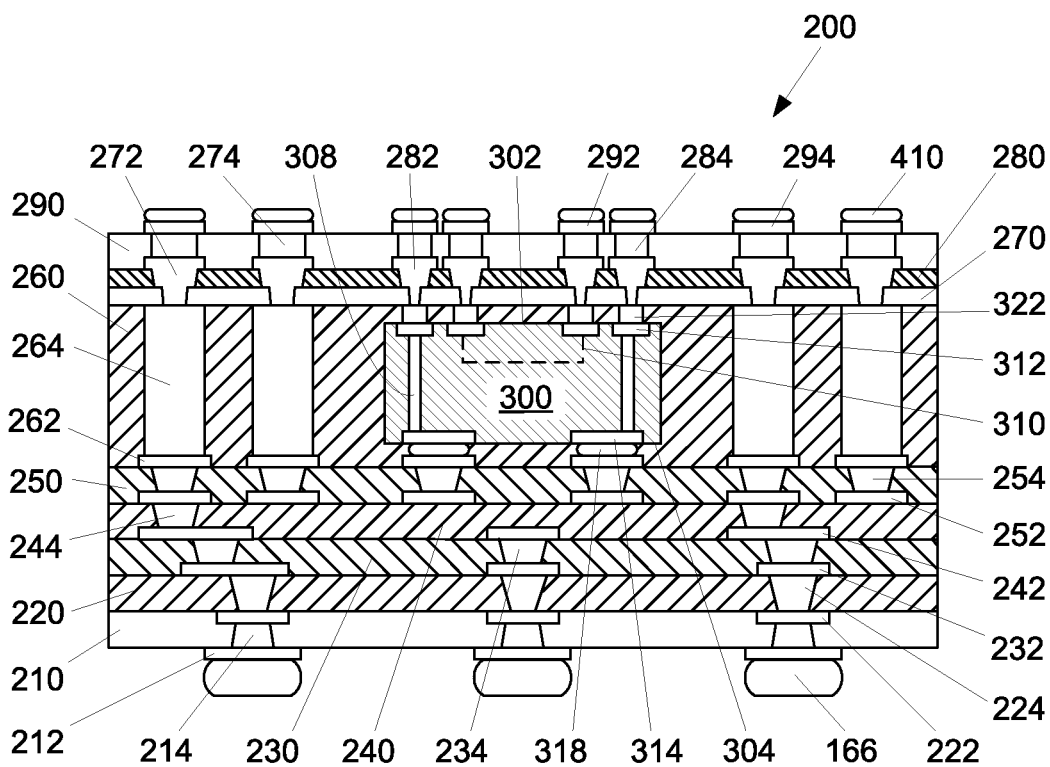

As shown in FIG. 15, the planar carrier panel 180 and release layer 182 may be removed and the first lower conductive traces 222 may be formed on the first lower dielectric layer 220. As shown in FIG. 16, the lower connection dielectric layer 210, such as a solder resist material, may be formed on the first lower dielectric layer 220. As shown in FIG. 17, the lower connection vias 214 may be formed through the lower connection dielectric layer 210. The package-to-carrier bond pads 212 may be formed on the lower connection dielectric layer 210 and electrically attached to the lower connection vias 214. The package-to-carrier substrate interconnects 166 may them be formed on the package-to-carrier bond pads 212, thereby forming the package substrate 200. The package substrate 200 may then be integrated into the integrated circuit package 110, as illustrated in FIG. 1.

Figure 18:
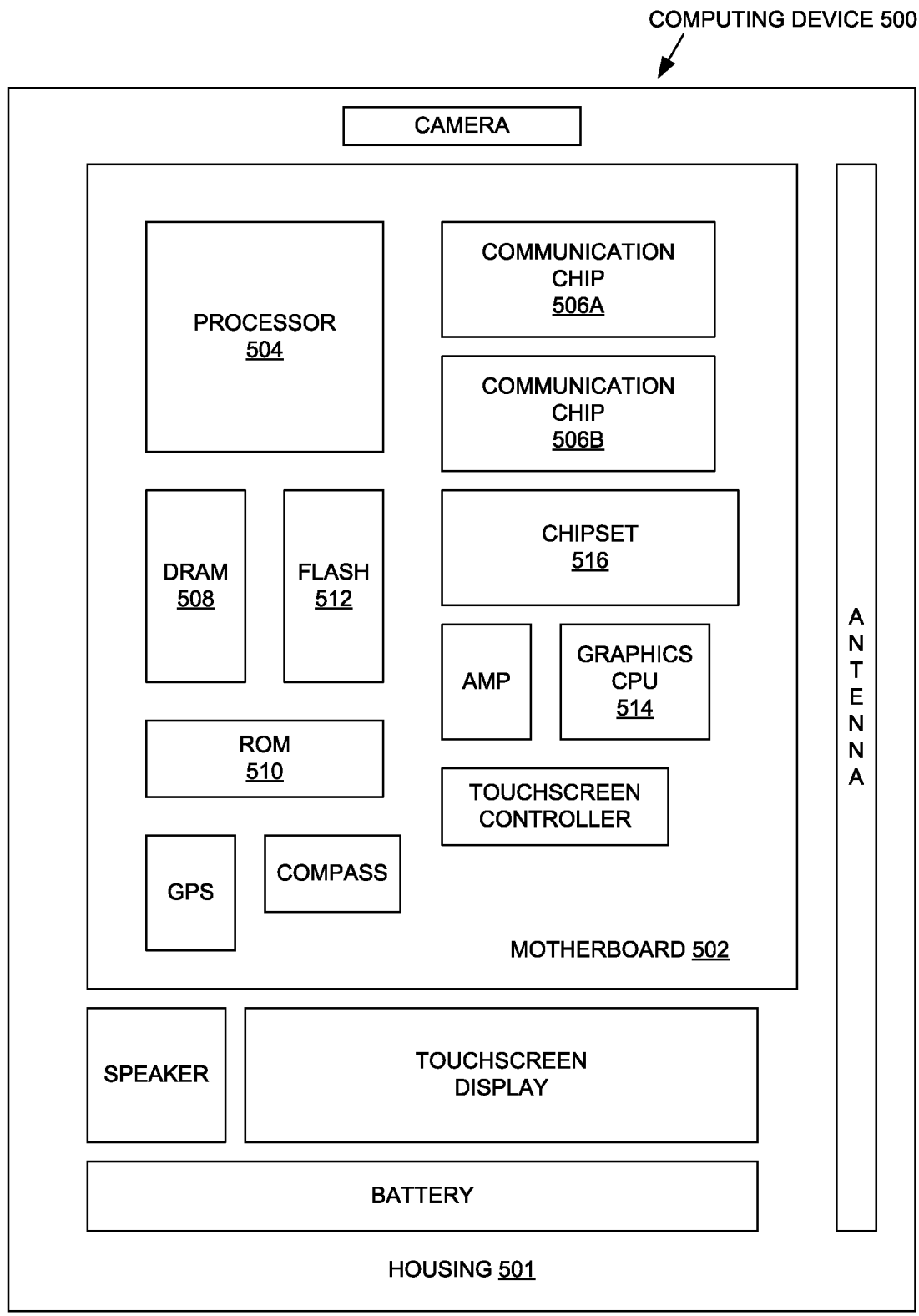
FIG. 18 is an electronic system, according to one embodiment of the present description.

FIG. 18 illustrates an electronic or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising a package substrate, wherein the package substrate comprises at least one bridge embedded in an embedding dielectric layer, at least one conductive pillar extending through the embedding dielectric layer, a fine pitch dielectric layer having an upper surface on the embedding dielectric layer; a coarse pitch dielectric layer on the upper surface of the fine pitch dielectric layer, and at least one hybrid conductive via extending through the first dielectric layer and the second dielectric layer wherein the hybrid conductive via resides on the upper surface of the first dielectric layer and wherein the hybrid conductive via comprises a single conductive material; and at least one integrated circuit device electrically attached to at least one of the at least one bridge and the at least one conductive pillar of the package substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-18. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an apparatus comprising a fine pitch dielectric layer having an upper surface; a coarse pitch dielectric layer on the upper surface of the fine pitch dielectric layer; and at least one hybrid conductive via extending through the fine pitch dielectric layer and the coarse pitch dielectric layer wherein the hybrid conductive via resides on the upper surface of the fine pitch dielectric layer and wherein the hybrid conductive via comprises a single conductive material.

In Example 2, the subject matter of Example 1 can optionally include the conductive via comprising a fine via portion extending through the fine pitch dielectric layer and a coarse via portion extending through the coarse pitch dielectric layer, and wherein an average width of the fine via portion of the conductive via is less than an average width of the coarse via portion of the conductive via.

In Example 3, the subject matter of any of Examples 1 to 2 can optionally include the average width of the first portion of the conductive via being between about 10 percent and 15 percent of the average width of the second portion of the conductive via.

In Example 4, the subject matter of any of Examples 1 to 3 can optionally include the at least one hybrid conductive via further comprising a conductive trace portion adjacent the coarse via portion, wherein the conductive trace portion resides on an upper surface of the second dielectric layer.

In Example 5, the subject matter of any of Examples 1 to 4 can optionally include the fine pitch conductive layer being selected for the group comprising nitrides, carbides, and oxynitrides.

In Example 6, the subject matter of Example 5 can optionally include the fine pitch conductive layer comprising amorphous silicon nitride.

Example 7 is an apparatus comprising a package substrate, wherein the package substrate comprises at least one bridge embedded in an embedding dielectric layer; at least one conductive pillar extending through the embedding dielectric layer; a fine pitch dielectric layer having an upper surface on the embedding dielectric layer; a coarse pitch dielectric layer on the upper surface of the fine pitch dielectric layer; at least one hybrid conductive via extending through the first dielectric layer and the second dielectric layer wherein the hybrid conductive via resides on the upper surface of the first dielectric layer and wherein the hybrid conductive via comprises a single conductive material; and at least one integrated circuit device electrically attached to at least one of the at least one bridge and the at least one conductive pillar of the package substrate.

In Example 8, the subject matter of Example 7 can optionally include the conductive via comprising a fine via portion extending through the fine pitch dielectric layer and a coarse via portion extending through the coarse pitch dielectric layer, and wherein an average width of the fine via portion of the conductive via is less than an average width of the coarse via portion of the conductive via.

In Example 9, the subject matter of any of Examples 7 to 8 can optionally include the average width of the first portion of the conductive via being between about 10 percent and 15 percent of the average width of the second portion of the conductive via.

In Example 10, the subject matter of any of Examples 7 to 9 can optionally include the at least one hybrid conductive via further comprising a conductive trace portion adjacent the coarse via portion, wherein the conductive trace portion resides on an upper surface of the second dielectric layer.

In Example 11, the subject matter of any of Examples 7 to 10 can optionally include the fine pitch conductive layer being selected for the group comprising nitrides, carbides, and oxynitrides.

In Example 12, the subject matter of Example 11 can optionally include the fine pitch conductive layer comprising amorphous silicon nitride.

In Example 13, the subject matter of any of Examples 7 to 12 can optionally include the bridge including at least one interconnection route.

In Example 14, the subject matter of any of Examples 7 to 13 can optionally include the bridge including at least one through-bridge conductive via.

Example 15 is an electronic system, comprising a board and an integrated circuit package electrically attached to the board, wherein the integrated circuit package comprises an integrated circuit package comprising a package substrate, wherein the package substrate comprises: at least one bridge embedded in an embedding dielectric layer, wherein in the at least one bridge includes at least one device-to-device interconnection route; at least one conductive pillar extending through the embedding dielectric layer; a fine pitch dielectric layer having an upper surface on the embedding dielectric layer; a coarse pitch dielectric layer on the upper surface of the fine pitch dielectric layer; at least one hybrid conductive via extending through the first dielectric layer and the second dielectric layer wherein the hybrid conductive via resides on the upper surface of the first dielectric layer and wherein the hybrid conductive via comprises a single conductive material; a first integrated circuit device electrically attached to the at least one bridge of the package substrate; and a second integrated circuit device electrically attached to the package substrate attached to the at least one bridge of the package substrate, wherein the at least one device-to-device interconnection route electrically connects the first integrated circuit device and the second integrated circuit device.

In Example 16, the subject matter of Example 15 can optionally include the conductive via comprising a fine via portion extending through the fine pitch dielectric layer and a coarse via portion extending through the coarse pitch dielectric layer, and wherein an average width of the fine via portion of the conductive via is less than an average width of the coarse via portion of the conductive via.

In Example 17, the subject matter of any of Examples 15 to 16 can optionally include the average width of the first portion of the conductive via being between about 10 percent and 15 percent of the average width of the second portion of the conductive via.

In Example 18, the subject matter of any of Examples 15 to 17 can optionally include the at least one hybrid conductive via further comprising a conductive trace portion adjacent the coarse via portion, wherein the conductive trace portion resides on an upper surface of the second dielectric layer.

In Example 19, the subject matter of any of Examples 15 to 18 can optionally include the fine pitch conductive layer comprising amorphous silicon nitride.

In Example 20, the subject matter of any of Examples 15 to 19 can optionally include the bridge including at least one through-bridge conductive via.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
a bridge die embedded in an embedding dielectric layer, the bridge die comprising a first surface and an opposing second surface;
a conductive via on and extending over the first surface of the bridge die, wherein the embedding dielectric layer is over the first surface of the bridge die and the conductive via is embedded in the embedding dielectric layer;
a fine pitch dielectric layer directly on the embedding dielectric layer, the fine pitch dielectric layer having an upper surface;
a coarse pitch dielectric layer on the upper surface of the fine pitch dielectric layer; and
at least one hybrid conductive via extending through the fine pitch dielectric layer and the coarse pitch dielectric layer to contact the conductive via, wherein the hybrid conductive via is on the upper surface of the fine pitch dielectric layer, and wherein the hybrid conductive via comprises a single conductive material.

2. The apparatus of claim 1, wherein the hybrid conductive via comprises a fine via portion of the single conductive material extending through the fine pitch dielectric layer and a coarse via portion of the single conductive material extending through the coarse pitch dielectric layer, and wherein an average width of the fine via portion is less than an average width of the coarse via portion.

3. The apparatus of claim 2, wherein the average width of the fine via portion is not less than 10 percent and not more than 15 percent of the average width of the coarse via portion.

4. The apparatus of claim 2, wherein the hybrid conductive via further comprises a conductive trace portion of the single conductive material on the coarse via portion, and wherein the conductive trace portion is on an upper surface of the coarse pitch dielectric layer.

5. The apparatus of claim 1, wherein the fine pitch dielectric layer comprises one of silicon oxide, aluminum nitride, silicon nitride, titanium carbide, silicon carbide, aluminum oxynitride, or silicon oxynitride.

6. The apparatus of claim 5, wherein the fine pitch dielectric layer comprises amorphous silicon nitride.

7. The apparatus of claim 5, wherein the fine pitch dielectric layer has a thickness of not more than 250 nm.

8. The apparatus of claim 5, wherein the coarse pitch dielectric layer comprises an epoxy resin.

9. The apparatus of claim 1, further comprising:
a package substrate, wherein the package substrate comprises the bridge die, the embedding dielectric layer, the conductive via, the fine pitch dielectric layer, the coarse pitch dielectric layer, and the hybrid conductive via; and
at least one integrated circuit device electrically attached to the bridge die.

10. The apparatus of claim 9, further comprising:
a board; and
an integrated circuit package electrically attached to the board, the integrated circuit package comprising the package substrate, the integrated circuit device, and a second integrated circuit device electrically attached to the bridge die.

11. An apparatus, comprising:
a bridge embedded in a first dielectric layer, the bridge comprising a first surface and an opposing second surface;
a conductive via on and extending over the first surface of the bridge, wherein the first dielectric layer is over the first surface of the bridge and the conductive via is embedded in the first dielectric layer;
a second dielectric layer directly on the first dielectric layer, the second dielectric layer having an upper surface;
a third dielectric layer on the upper surface of the second dielectric layer; and
a hybrid conductive via extending through the second dielectric layer and the third dielectric layer to contact the conductive via, wherein the hybrid conductive via is on the upper surface of the second dielectric layer, wherein the hybrid conductive via comprises a single conductive material, wherein the hybrid conductive via comprises a fine via portion of the single conductive material extending through the second dielectric layer and a coarse via portion of the single conductive material extending through the third dielectric layer, an average width of the fine via portion less than an average width of the coarse via portion, and wherein the hybrid conductive via comprises a single conductive material.

12. The apparatus of claim 11, wherein the average width of the fine via portion is not less than 10 percent and not more than 15 percent of the average width of the coarse via portion.

13. The apparatus of claim 12, wherein the hybrid conductive via further comprises a conductive trace portion of the single conductive material on the coarse via portion, and wherein the conductive trace portion is on an upper surface of the third dielectric layer.

14. The apparatus of claim 13, further comprising:
a fourth dielectric layer adjacent to the conductive trace portion and on the third dielectric layer, wherein the second dielectric layer comprises silicon nitride having a thickness of between 50 nm and 250 nm, the third dielectric layer comprises an epoxy resin, and the fourth dielectric layer comprises a solder resist layer.

15. The apparatus of claim 11, wherein the second dielectric layer comprises one of silicon oxide, aluminum nitride, silicon nitride, titanium carbide, silicon carbide, aluminum oxynitride, or silicon oxynitride.

16. The apparatus of claim 15, wherein the second dielectric layer comprises amorphous silicon nitride.

17. The apparatus of claim 15, wherein the second dielectric layer has a thickness of not more than 250 nm.

18. The apparatus of claim 15, wherein the third dielectric layer comprises an epoxy resin.

19. The apparatus of claim 11, further comprising:
a package substrate, wherein the package substrate comprises the bridge die, the first dielectric layer, the conductive via, the second dielectric layer, the third dielectric layer, and the hybrid conductive via; and
at least one integrated circuit device electrically attached to the bridge die.

20. The apparatus of claim 19, further comprising:
a board; and
an integrated circuit package electrically attached to the board, the integrated circuit package comprising the package substrate, the integrated circuit device, and a second integrated circuit device electrically attached to the bridge die.

* * * * *